United States Patent [19]
Yedur et al.

[11] Patent Number: 6,057,914
[45] Date of Patent: May 2, 2000

[54] METHOD FOR DETECTING AND IDENTIFYING A LENS ABERRATION BY MEASUREMENT OF SIDEWALL ANGLES BY ATOMIC FORCE MICROSCOPY

[75] Inventors: Sanjay K. Yedur, Santa Clara; Bhanwar Singh, Morgan Hill; Bharath Rangarajan, Santa Clara, all of Calif.

[73] Assignee: Advanced Micro Devices, Inc., Sunnyvale, Calif.

[21] Appl. No.: 09/289,519

[22] Filed: Apr. 9, 1999

[51] Int. Cl.[7] .................................................. G01B 9/00
[52] U.S. Cl. ............................................................. 356/124
[58] Field of Search .................................... 356/124–127, 356/345, 354, 353; 250/307, 310, 306, 234; 359/368; 430/30, 312, 313; 355/55

[56] References Cited

U.S. PATENT DOCUMENTS

| | | | |
|---|---|---|---|
| 4,701,606 | 10/1987 | Tanimoto et al. | 356/124 |
| 5,283,442 | 2/1994 | Martin et al. | 250/307 |
| 5,321,493 | 6/1994 | Kamon | 356/124 |
| 5,362,585 | 11/1994 | Adams | 430/30 |
| 5,402,224 | 3/1995 | Hirukawa et al. | 355/53 |
| 5,420,796 | 5/1995 | Weling et al. | 364/468 |
| 5,426,302 | 6/1995 | Marchman et al. | 250/306 |
| 5,476,006 | 12/1995 | Fujii et al. | 73/105 |
| 5,489,774 | 2/1996 | Akamine et al. | 250/234 |
| 5,517,027 | 5/1996 | Nakagawa et al. | 250/306 |
| 5,528,033 | 6/1996 | Lo et al. | 250/307 |
| 5,621,652 | 4/1997 | Eakin | 364/490 |
| 5,741,614 | 4/1998 | McCoy et al. | 430/30 |
| 5,844,672 | 12/1998 | Kwon | 356/124 |
| 5,978,085 | 11/1999 | Smith et al. | 356/354 |

*Primary Examiner*—Hoa Q. Pham
*Attorney, Agent, or Firm*—Renner, Otto, Boisselle & Sklar, P.L.L.

[57] ABSTRACT

The present invention provides a method of detecting a lens aberration in a semiconductor production process, comprising the steps of:

forming a feature on a substrate by a process including a step of exposing a radiation-sensitive material to radiation, wherein said radiation passes through a lens;

obtaining data relating to a sidewall angle at a plurality of adjacent locations of said feature by scanning at least one surface of said feature with an atomic force microscope;

calculating the sidewall angle at said plurality of adjacent locations of said feature based on the data obtained by the atomic force microscope;

comparing the sidewall angle obtained from the calculation step to a design sidewall angle for a lens free of aberration, thereby detecting the lens aberration when the comparison reveals a substantial difference between the calculated side wall angle and the design sidewall angle; and identifying a lens position of the lens aberration by extrapolating from the locations of said feature having said substantial difference.

17 Claims, 4 Drawing Sheets

METHOD FOR DETECTING AND IDENTIFYING A LENS ABERRATION BY MEASUREMENT OF SIDEWALL ANGLES BY ATOMIC FORCE MICROSCOPY

FIELD OF THE INVENTION

The present invention relates generally to integrated circuit processing methods and particularly to detection and identification of a lens aberration such as, e.g., a coma lens aberration, in a lens used to focus radiation on radiation-sensitive materials by atomic force microscope measurement of side wall angles in the radiation-sensitive materials formed by application of radiation through the lens.

BACKGROUND OF THE INVENTION

The manufacture of integrated circuits is a complicated and expensive process sometimes involving dozens of process steps. To ensure that this manufacturing effort proceeds with the maximum efficiency, every source of deviation or defect should be sought out and eliminated.

One of the critical steps in IC manufacturing is photolithography, which is used to define key features of an integrated circuit, including active regions, transistor gates, and signal and interconnect lines. In photolithography, a photosensitive polymer photoresist is deposited on a silicon substrate, exposed by a patterned light focused by a lens, then chemically developed. Depending on the type of photoresist, during developing the exposed photoresist is removed (positive photoresist) or retained in preference to the unexposed photoresist (negative photoresist), which results in the formation of a patterned photoresist.

As is well known, the light pattern applied to the photoresist layer is obtained by exposing the photoresist to actinic (exposing) radiation through a mask (reticle). The mask includes opaque and transparent portions defaming a pattern. An image of the pattern on the mask is thus transferred to the photoresist which is then developed in order to define a corresponding pattern in the photoresist. If the photoresist is a positive type photoresist, the portions of the photoresist which are exposed to the radiation, after being developed, are removed, hence leaving the underlying portions of the substrate exposed for a subsequent etching step. In contrast, the developed positive photoresist remains over the nonexposed portions. Hence a subsequent etching step will define the mask pattern in the underlying substrate as defined by the mask image in the photoresist. Using the patterned photoresist as a mask, further IC processing steps can then occur, possibly including etching and ion implantation, oxide growth or metallization for signal lines or interconnects.

Ideally, IC features, e.g., lines, created by photolithography would have straight, vertical sidewalls. However, in reality, the sidewalls of a photolithographically defined IC feature can deviate substantially from straight and vertical, which can cause problems in subsequent IC processing steps. Defects in the lens, known as lens aberrations, may result in such sidewall deviations or defects, among others. A particular type of lens aberration, known as coma lens aberration, is of particular interest and is used as an example herein, since it can result in a change of the sidewall profiles, particularly resulting in sidewalls having angular deviations from vertical or design angles, either by inwardly sloping (undercutting) or by being outwardly sloped.

Photoresist patterns may be used to characterize the performance of optical exposure systems, especially the projection lens. These exposure systems are used to form the above-described features on integrated circuits. Test patterns such as a dense line/space structure allow the performance to be measured in a standard way. However, extensive use of test patterns expends much valuable wafer space.

In the prior art for test purposes, to make sure that the photolithographic process is working as desired, it is therefore necessary to examine the sidewalls of the photoresist features after exposure and development for angle, curvature and any undesirable artifacts present. It was also frequently necessary to make extensive use of test patterns. One prior art approach is to form the photoresist layer, expose it through the mask, develop the photoresist and then physically slice the photoresist and the underlying wafer to form a cross section which can be examined by a scanning electron microscope. This is very time consuming and costly and of course destroys the wafer.

An alternative is to make "top down" measurements, without slicing, using a scanning electron microscope or an optical microscope. However, this does not give much useful information about the feature sidewalls, since this method does not allow access to the sidewalls.

Atomic force microscopy (AFM) has been applied for measurement of sidewall angles, as a method for detecting defects in IC devices during manufacture and as a method for verifying process models. However, AFM has not been applied to detect specific sidewall angle defects as a basis for detecting and identifying lens aberrations such as the coma lens aberration. Any information obtained from AM measurements of sidewall angles has not been used to identify sources of defects in parts of the lithography system other than the photomask or reticle.

The various known methods for verifying IC processing steps have primarily focused attention on the mask and procedures for developing and removing the photoresist. As features of IC devices become progressively smaller, attention must be directed to additional elements of the IC processing steps in order to provide maximum efficiency and minimum defects or deviations from design parameters. Thus, the need exists for a method to detect and identify the location of lens aberrations, which can be a significant source of deviations or defects in IC devices.

SUMMARY OF THE INVENTION

The present invention provides a method of detecting a lens aberration in a semiconductor production process, comprising the steps of:

(a) forming a feature on a substrate by a process including a step of exposing a radiation-sensitive material to radiation, wherein said radiation passes through a lens;

(b) obtaining data relating to a sidewall angle at a plurality of adjacent locations of said feature by scanning at least one surface of said feature with an atomic force microscope;

(c) calculating the sidewall angle at said plurality of adjacent locations of said feature based on the data obtained by the atomic force microscope;

(d) comparing the sidewall angle obtained from the calculation step to a design sidewall angle for a lens free of aberration, thereby detecting the lens aberration when the comparison reveals a substantial difference between the calculated side wall angle and the design sidewall angle; and (e) identifying a lens position of the lens aberration by extrapolating from the locations of said feature having said substantial difference.

In one embodiment, the sidewall deviates from vertical as a result of a coma lens aberration. In one embodiment, the sidewall deviates from vertical as a result of a spherical lens aberration. In one embodiment, the sidewall deviates from vertical as a result of an astigmatic lens aberration. In one embodiment, the sidewall deviates from vertical as a result of a monochromatic lens aberration. In one embodiment, the sidewall deviates from vertical as a result of a chromatic lens aberration.

In one embodiment, the sidewall extends outwardly as a result of a coma lens aberration.

In one embodiment, the sidewall is undercut as a result of a coma lens aberration.

In one embodiment, the process of forming the feature includes the steps of applying the radiation-sensitive material to a substrate and developing the radiationsensitive material to form the feature.

In one embodiment, the difference between the calculated side wall angle and the design side wall angle is less than about 10 degrees.

In one embodiment, the difference between the calculated side wall angle and the design side wall angle is less than about 5 degrees.

In one embodiment, the design side wall angle is normal to adjacent substrate surfaces.

In one embodiment, the method includes a step of locating the lens aberration on the lens by extrapolating from positions of said plurality of adjacent locations.

In one embodiment, the method includes a step of locating the lens aberration on the lens by repeating the process with a plurality of substrates and moving the lens with respect to each of said plurality of substrates prior to said repeating.

In one embodiment, the method includes a step of moving the lens suspected of harboring the lens aberration, and repeating the steps (a) to (e).

In one embodiment the step of moving the lens comprises rotating the lens in an X,Y plane defined by a surface of the substrate.

In one embodiment, the step of obtaining data relating to a sidewall angle comprises obtaining $X_s, Y_s$ data relating to a location of the sidewall angle.

In one embodiment, the step of identifying a lens position of the coma lens aberration on a lens L comprises determining a $X_L, Y_L$ location of the coma lens aberration on the lens L.

DETAILED DESCRIPTION

Figure 1:
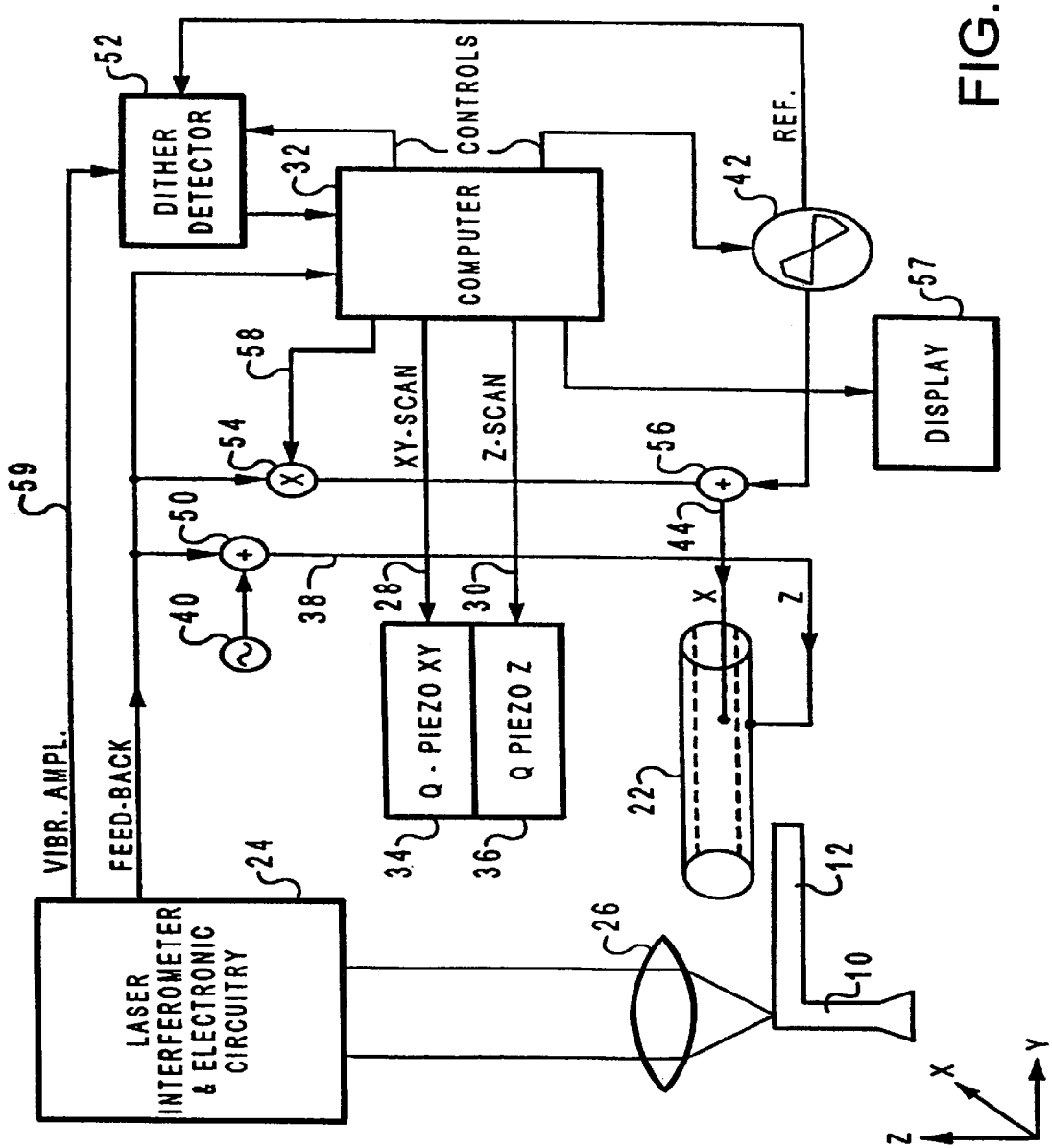
FIG. 1 is a schematic depiction of an apparatus for controlling the position of a probe tip of an atomic force microscope.

As used herein "scanning probe microscope" (SPM) means an instrument which provides a microscopic analysis of the topographical features or other characteristics of a surface by causing a probe to scan the surface. It refers to a class of instruments which employ a technique of mapping the spatial distribution of a surface property, by localizing the influence of the property to a small probe. The probe moves relative to the sample and measures the change in the property or follows constant contours of the property. Depending on the type of SPM, the probe either contacts or rides slightly (up to a few hundred Angstroms, Å) above the surface to be analyzed. Scanning probe microscopes include devices such as atomic force microscopes (AFMs), scanning tunneling microscopes (STMs), scanning acoustic microscopes, scanning capacitance microscopes, magnetic force microscopes, scanning thermal microscopes, scanning optical microscopes, and scanning ion-conductive microscopes. In the present specification, specific reference is made to an AFM device, but it is to be understood that other SPM devices may be included and may be used interchangeably with the AFM.

"Probe" means the element of an AFM which rides on or over the surface of the sample and acts as the sensing point for surface interactions. In an AFM the probe includes a flexible cantilever and a microscopic tip which projects from an end of the cantilever. In an STM the probe includes a sharp metallic tip which is capable of sustaining a tunneling current with the surface of the sample. This current can be measured and maintained by means of sensitive actuators and amplifying electronics. In a combined AFM/STM the probe includes a cantilever and tip which are conductive, and the cantilever deflection and the tunneling current are measured simultaneously.

"Atomic Force Microscope" (also referred to as a Scanning Force Microscope) means an SPM which senses the topography of a surface by detecting the deflection of a cantilever as the sample is scanned. An AFM may operate in a contacting mode, in which the tip of the probe is in contact with the sample surface, or a noncontacting mode, in which the tip is maintained at a spacing of about 50 Å. or greater above the sample surface. The cantilever deflects in response to electrostatic, magnetic, van der Waals or other forces between the tip and surface. In these cases, the deflection of the cantilever from which the tip projects is measured.

Scanning probe microscopes (SPMs) are used to obtain extremely detailed analyses of the topographical or other features of a surface, with sensitivities extending down to the scale of individual atoms and molecules. Several components are common to practically all scanning probe microscopes. The essential component of the microscope is a tiny probe positioned in very close proximity to a sample surface and providing a measurement of its topography or some other physical parameter, with a resolution that is determined primarily by the shape of the tip and its proximity to the surface. In an atomic force microscope (AFM), the probe includes a tip which projects from the end of a cantilever. The tip may be very sharp to achieve maximum lateral resolution by confining the force interaction to the end of the tip. The tip may have other shapes, depending on the topography of the surfaces to be scanned. A deflection sensor detects the deflection of the cantilever and generates a sample deflection signal, which is then compared with a desired or reference deflection signal. The reference signal is then subtracted from the sample deflection signal to obtain a difference signal, which is delivered to a controller. Based on the magnitude and direction of the difference signal, the actual topography of the substrate can be calculated. The actual topography can then be compared to a design topography to detect, e.g., deviations from, or defects in, the substrate. Based also on the data obtained, the exact location of a selected feature on the substrate may be determined.

Referring now to the figures and to FIG. 1 in particular, there is shown a schematic block diagram of a preferred embodiment of an arrangement for controlling the tip position of an AFM for profiling near-vertical structures such as a sidewall of a trench or line in a substrate. FIG. 1 shows a tip 10 having a longitudinal axis, which is designated herein to be the Z-direction. The X-axis and Y-axis directions each shall be understood to refer to a direction normal to the longitudinal axis of the tip 10, and normal to each other.

A cantilever 12 to which the tip 10 is attached is coupled to a fast X-Z piezoelectric tube scanner 22 for rapidly and accurately controlling the position of the tip 10 in both the X-axis direction and the Z-axis direction. Preferably, vibratory motion of the tip 10 is measured by a laser interferometer and electronic circuitry 24 which causes a laser beam to be transmitted through a collimating lens 26 onto the back of the cantilever 12 and which receives the beam reflected from the cantilever 12. The reflected beam travels back through the lens 26 to a detector in the laser interferometer and electronics circuitry 24. Such AFM systems are known in the art. The laser interferometer and associated electronic circuitry 24 accurately detect the vibratory motion of the cantilever 12 and hence the tip 10 and provides output signals commensurate with the motion of the tip 10 for controlling the scan track of the tip 10 as will be described hereinafter.

The position of the tip 10 is scanned in the X,Y-plane and moves in two modes in the Z-axis direction, where the X,Y-plane is a plane parallel to the top surface of the substrate 20 (FIG. 2) and where the Z-axis is in the depth or vertical direction (as shown) of the trench or line, responsive to scan signals provided along respective conductors 28 and 30 from a computer 32 to Q-piezoelectrics 34 for X-axis and Y-axis displacements (X,Y-plane displacement) and Q-piezoelectric 36 for Z-axis displacement.

In addition to the scan motion in the X-Y direction and the displacement in the Z-axis direction, provided in response to scan signals from the computer 32 along the conductors 28 and 30, the tip 10 is vibrated in the Z-axis direction at a high frequency, typically at a resonance frequency of 300 KHz, by virtue of a signal from a high frequency oscillator 40 provided along the conductor 38 to the piezoelectric tube scanner 22.

In addition to the foregoing motions, the tip 10 is also made to undergo dither motion about its nominal position in the X-axis direction (the trench. width direction) at a lower frequency that the Z-axis direction dither. The X-axis direction dither is preferably at an amplitude of approximately 10 Å at a frequency of 3 kHz. The X-axis direction dither motion is provided by virtue of a signal from an oscillator 42 along a conductor 44 to the piezoelectric tube scanner 22.

The tip 10 is coupled to a X-Z piezoelectric tube scanner 22 for faster position control. However, the scanner provides only a relatively limited range of motion, approximately one micron. Therefore, the scanner itself is coupled to a long range, but slower responding, scanner (not shown). The long range scanner is also controlled by the Q-piezoelectrics 34 and the Q-piezoelectric 36. The tube scanner 22 is controlled by the signals provided along the conductors 38 and 44.

The signal corresponding to the high frequency or Z-axis signal is provided to a summer 50. The summer 50 combines the signal from the oscillator 40 with the feedback signal to adjust the amplitude of the Z-axis direction dither of the tip 10.

A second output 59 from the laser interferometer and electronic circuitry 24 provides a signal corresponding to the X-axis direction dither motion to a dither detector 52 which preferably is a lock-in detector. Another input to the dither detector 52 is a reference signal from the x-axis direction oscillator 42.

The output of the dither detector 52 provides information as to the signal magnitude of the corresponding to the X-axis direction dither motion, which is indicative of the slope of the surface, as will be described below. The output signal of the dither detector is provided to the computer 32. Another input to the computer 32 is the feedback signal from laser interferometer and electronic circuitry 24. The computer, in turn, calculates and provides an X feedback direction signal to a multiplier 54 which adjusts the proportion of the X-axis to the Z-axis feedback motion. The other input to the multiplier 54 is the Z-axis direction feedback signal from the laser interferometer and electronic circuitry 24.

The output signal from the multiplier 54 is provided to a summer 56 where the output signal is combined with the signal from the X-axis direction oscillator 42.

As will be described in greater detail below, the piezoelectric tube scanner 22 controls the tip motion in the Z-axis direction responsive to the feedback signal from the laser interferometer and electronic circuitry 24 in a conventional manner. The X-axis direction position is controlled responsive to the feedback signal from the laser interferometer and electronic circuitry 24 as modified by the slope dependent signal provided from the computer 32 to the multiplier 54 along the conductor 58. The computer 32 provides the additional function of maintaining the X,Y and Z position of the tip which can be determined from the voltages applied to the Q-piezoelectrics 34, 36 or from independent position sensors in order to provide a two-dimensional or three-dimensional representation of the sidewall surface being profiled as a function of position of the tip in space. The data can be stored and/or provided in tabular form or be converted to an image which may be output to a display 57.

Figure 2:
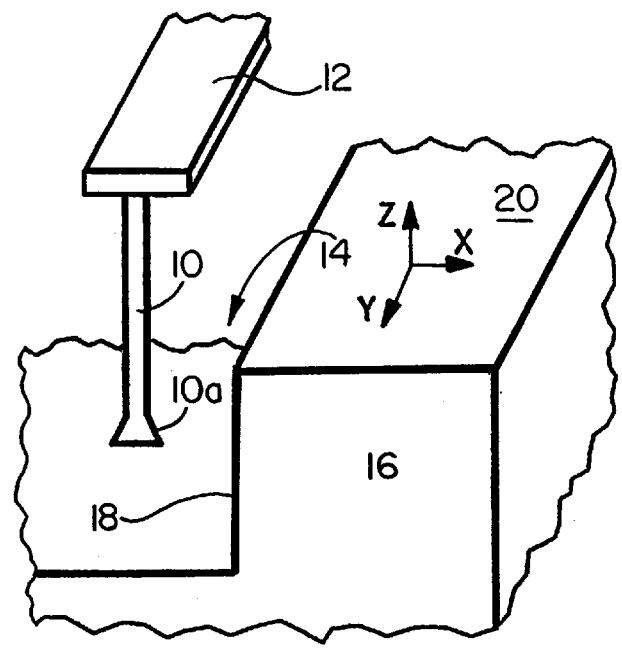
FIG. 2 is a schematic depiction of a tip of an atomic force microscope probe disposed within a trench located in a substrate, in which the trench has vertical side walls.

FIG. 2 is a schematic block diagram (not to scale) of the tip 10 coupled to the cantilever 12 of a AFM, as described above. In FIG. 2 the tip 10 is disposed in a trench 14 near a line 16 having a sidewall 18. The trench 14 and the line 16 are features on a substrate 20. The tip 10 of the AFM detects the sidewall 18 in a process of detecting a sidewall deviation which may be due to a lens aberration, such as a coma lens aberration. The sidewall 18 on the line 16 shown in FIG. 2 has a vertical sidewall angle according to design. The sidewall angle of the sidewall 18 is vertical with respect to the X,Y plane defined by the X,Y surface of the substrate 20, as shown in FIG. 2.

A conventionally shaped, sharp-pointed tip may be inadequate for profiling a structure having a near-vertical wall, or for profiling a non-vertical sidewall, particularly when the height of the trench is greater that approximately 100 Å. It has been determined that improved results are obtained when the tip 10 is in the shape of a boot as shown generally in FIGS. 1–4. Tips having a boot shape are fabricated using several lithographic steps in a combination of dry and wet etching processes. The process it stopped before the tip is formed into a sharp pyramidal tip. The width of the enlarged end 10a should be large enough to allow the edge of the tip 10 to closely approach the sidewall, even when the sidewall is undercut as described below.

The sidewall 18 of the line 16 shown schematically in FIG. 2 is vertical, i.e., the Z-direction of the sidewall 18 is normal to a plane in the X,Y directions defined by the horizontal surface of the substrate 20, which is normally the design sidewall angle. The present invention is directed to detecting non-vertical sidewall angles, which result from lens aberrations such as the coma lens aberration. The coma-lens aberration arises as a result of a coma defect or aberration, in a projection lens, such as a reduction lens or a condenser lens in a lithography system.

As known by those of skill in the art, a wide beam of light rays incident on a lens parallel to the axis is not brought to a focus at a single unique point. The resulting image defect is known as a spherical aberration. Defects in the shape of the lens, or in the angle at which incident light strikes the lens, or defects in the refractive index of a portion of the lens give rise to other lens aberrations. Such lens aberrations may manifest in imperfections or deviations from design in a wafer substrate which has been formed by optical lithography. Such imperfections may include sidewall angle deviations, i.e., deviations from the design angle of a sidewall Z-component, relative to the X,Y components of wafer features such as lines and horizontal surfaces.

In the coma lens aberration, for example, the image of an object point has a comet-like appearance, in which an image which should be circular instead has a "tail". The imperfect coma image arises from an imperfection in the shape of the lens. The coma lens aberration may manifest as a sidewall angle deviation from a design sidewall angle. Such deviation may be detected by an AFM.

Astigmatism is another monochromatic lens aberration which may result in imperfections in a wafer substrate which has been exposed to actinic radiation passing through a lens having this aberration. In astigmatism, light incident on a lens results in an image having focal planes which deviate radially. The astigmatism lens aberration may result in wafer imperfections or deviations such as sidewall angle deviations, or may result in other deviations. Such deviations may be detected by an AFM.

Other lens aberrations, such as curvature of field and distortion, also monochromatic lens aberrations may give rise to wafer imperfections such as sidewall angle deviations.

Another series of lens aberrations are known as chromatic lens aberrations. In chromatic lens aberrations, the degree of deviation varies with the wavelength, or color, of the incident light; hence the term chromatic is applied. Such defects may also give rise to deviations in sidewall angle, and thus such defects may be detected by an AFM.

The present invention provides an apparatus and method for detecting and locating a lens aberration, such as, e.g., a coma lens aberration or one of the other lens aberrations mentioned above, by detecting and locating a feature having imperfections comprising sidewall angles which deviate from the design vertical sidewall angle, and extrapolating from the position of the defect in the feature to locate the lens aberration.

In the present invention, the AFM is employed to detect deviations in sidewall angle, and, advantageously, can also measure the relevant critical dimensions of the wafer substrate, such as line width and line height. The combined data from the AFM may be advantageously employed to calculate a map of any desired portion of, e.g., a wafer substrate. Based on an analysis by a microprocessor programmed with available software, a map may be generated showing the locations and degree of all deviations from the design of a wafer substrate. Based on characteristic patterns of such deviations, obtained, e.g., from a study of the kind and location of the deviations, it is the purpose of the present invention to identify and locate lens aberrations giving rise to such deviations in the wafer substrate. Once such lens aberrations are identified and located, appropriate steps to deal with the problem may be taken.

Figure 3:
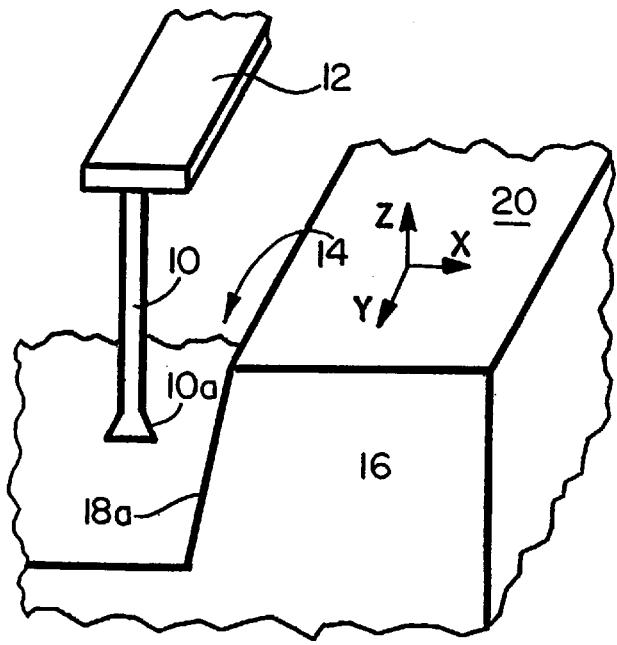
FIG. 3 is a schematic depiction of a tip of an atomic force microscope probe disposed within a trench having a non-vertical sidewall resulting in an outward slope due to a lens aberration.

FIG. 3 is a schematic depiction of a tip of the AFM probe 10 disposed in the trench 14 near the line 16 having a non-vertical sidewall 18a. The trench 14 and the line 16 are features of the substrate 20 as in FIG. 2. In FIG. 3, the non-vertical sidewall 18a has an outward slope due to, e.g., a coma lens aberration. The position of the outwardly sloped non-vertical sidewall 18a on the line 16, and the angle of the non-vertical sidewall 18a with respect to the X,Y surface of the substrate 20 are determined by the AFM. Data pertaining to the position on the line 16 of the non-vertical sidewall portion 18a, data pertaining to the angle formed by the non-vertical sidewall 18a with respect to the X,Y surface of the substrate 20, and data pertaining to other sidewalls are obtained from the motions of the tip 10 as detected by the laser interferometer of the AFM and are fed back to the computer 32.

Figure 4:
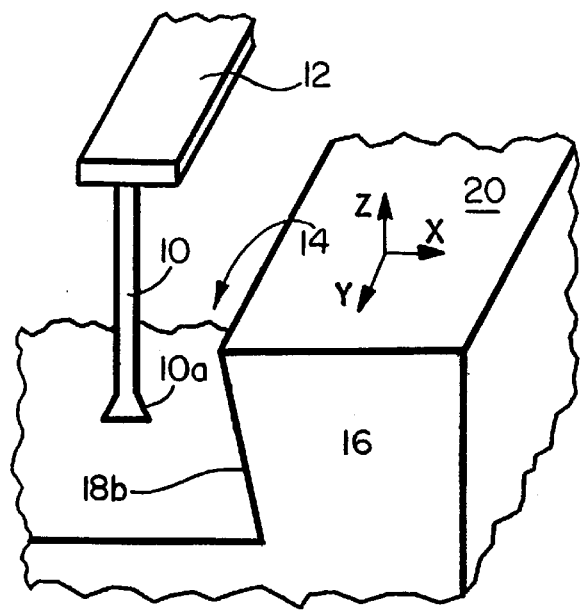
FIG. 4 is a schematic depiction of a tip of an atomic force microscope probe disposed within a trench having a non-vertical sidewall resulting in undercutting due to a lens aberration.

FIG. 4 is a schematic depiction of a tip of the AFM probe 10 disposed in the trench 14 near the line 16 having a non-vertical sidewall 18b. The trench 14 and the line 16 are features on the substrate 20, as in FIG. 2. The non-vertical sidewall 18b has an undercutting, inward slope due to, e.g., the coma lens aberration. The position of the undercut, inwardly sloped non-vertical sidewall 18b on the line 16, and the angle of the non-vertical sidewall 18b with respect to the X,Y surface of the substrate 20 are determined by the AFM. Data pertaining to the position on the line 16 of the non-vertical sidewall 18b, data pertaining to the angle formed by the non-vertical sidewall 18b with respect to the X,Y surface of the substrate 20, and data pertaining to the other sidewalls are obtained from the motions of the tip 10 as detected by the laser interferometer of the AFM and are fed back to the computer 32.

Figure 5:
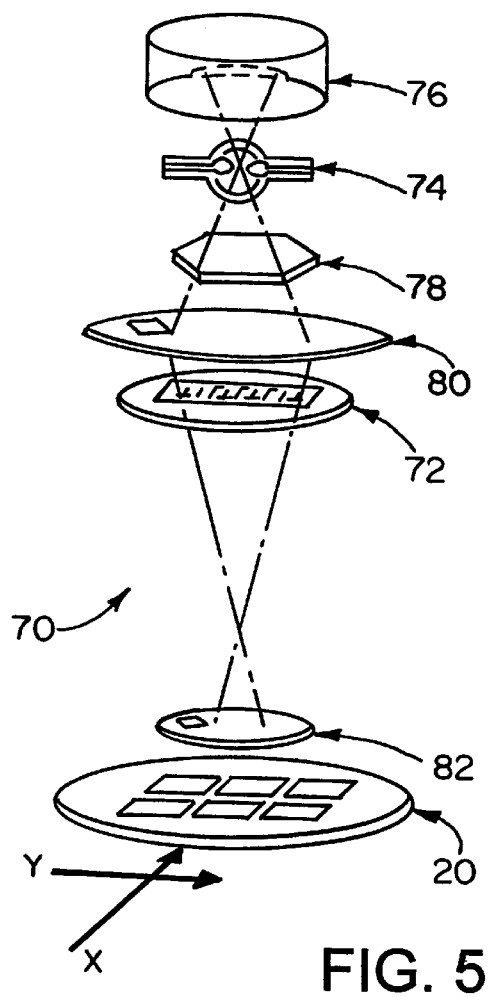
FIG. 5 is a schematic diagram of an exemplary stepper in a lithographic system for forming images on a substrate having a radiation-sensitive material thereon by directing radiation through a system including lenses onto the radiation-sensitive material in a selected pattern.

FIG. 5 is a highly schematic depiction of an exemplary reduction stepper system 70 used to transfer an image from a mask 72 to the wafer substrate 20. The stepper system 70 includes a light source 74, for example a mercury (Hg) arc lamp, a mirror 76, a filter 78 for selecting the desired wavelength from the output of the light source 74, a condenser lens 80, and a reduction lens 82. The present invention may be applied to the detection of defects in any of the elements of the stepper system 70. The wafer substrate 20 may be moved in an X,Y plane, as indicated in FIG. 5. The X,Y plane in FIG. 5 may be coplanar with the X,Y plane in FIG. 1.

The description set forth herein is particularly directed to detection of coma lens aberrations, which may occur in either the condenser lens 80 or the reduction lens 82. It is to be understood that the apparatus and methods described herein are generally applicable to detection of defects in the mask 72 or the filter 78 as well as the lenses, where those defects result in variation of sidewall angles from design values. It is to be further understood that, while the present description uses the coma lens aberration for exemplary purposes, that the present invention is broadly applicable to detection and identification of other known types of lens aberrations, as described herein.

The X,Y plane in which the wafer substrate 20 lies, and in which the probe 10 operates, may be conveniently divided into a grid having X,Y coordinates. The locations of defects, such as the non-vertical sidewalls 60 and 62, which are precisely located by the AFM probe 10, may be precisely identified in terms of the X,Y coordinates.

A similar X,Y plane exists in each of the lenses 80 and 82, the filter 78 and the mask 72. It should be understood, as is explained in more detail below, that positions on each one of the lens X,Y planes correspond to positions on the substrate 20. Thus, by precisely locating the position of defects in the X,Y plane of the substrate 20, a corresponding position, which may contain a defect giving rise to the defect in the substrate 20, is precisely located on each of the lenses 80 and 82, the filter 78 and the mask 72.

Figure 6:
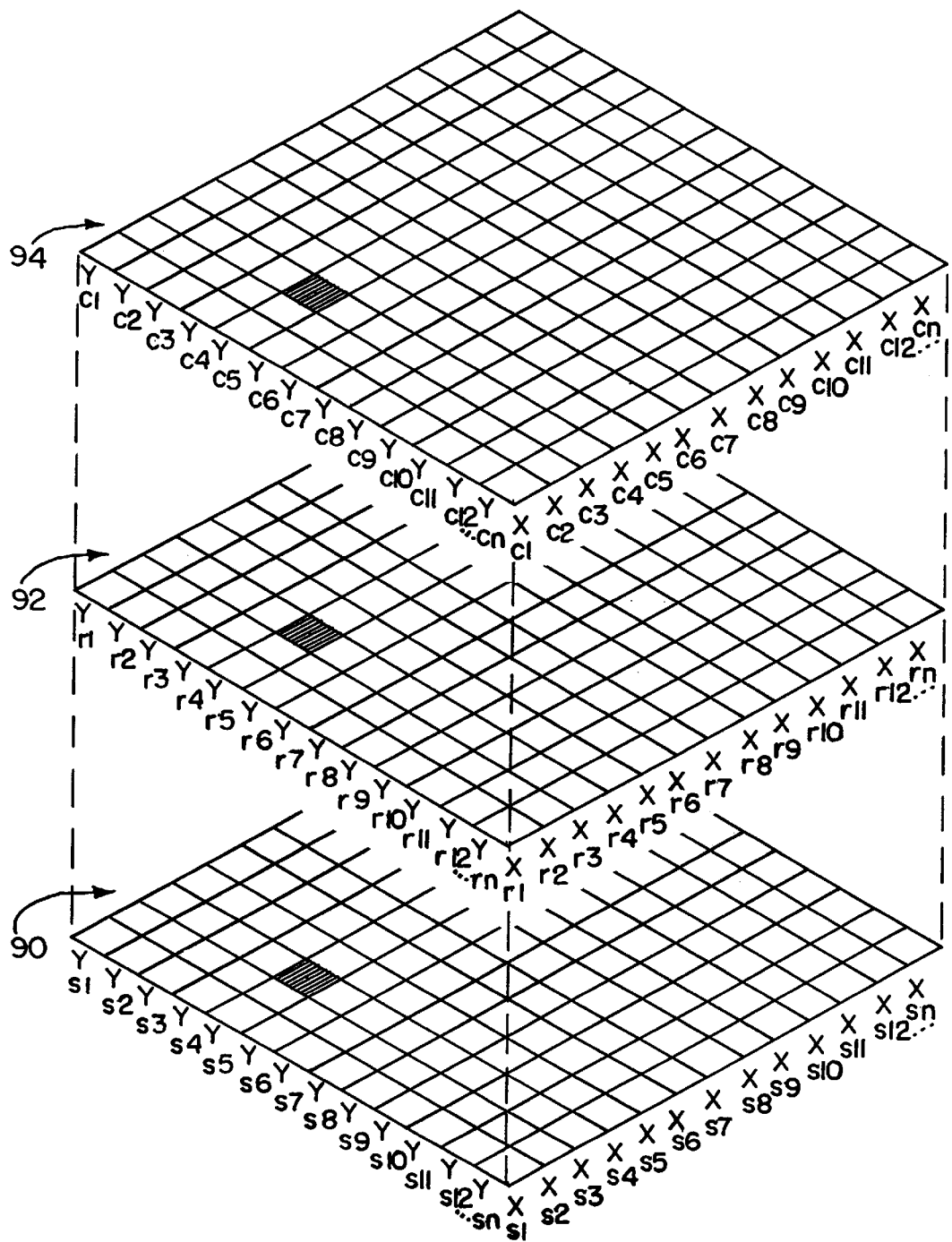
FIG. 6 is a schematic representation of grids corresponding to locations on each of a substrate, a reduction lens and a condenser lens.

FIG. 6 is a schematic representation of grids 90, 92 and 94 corresponding to locations on each of, respectively, a substrate, a reduction lens and a condenser lens. As shown in FIG. 6, each of the substrate 20, the condenser lens 80 and the reduction lens 82 may be divided into a grid pattern consisting of grid blocks identified by X,Y coordinates. In the substrate grid 90, each grid block on the substrate 20 may be designated $X_S, Y_S$. In a corresponding lens grid, each grid block on a lens L may be designated $X_L, Y_L$, for example. Thus, for the reduction lens grid 92, each grid block on the reduction lens 82 may be designated $X_R, Y_R$. For the condenser lens grid 94, each grid block on the condenser lens 80 may be designated $X_C, Y_C$. As shown and suggested in FIG. 6, each grid block $X_S, Y_S$ on the substrate 20 corresponds to a grid block $X_R, Y_R$ on the reduction lens 82 and to a grid block $X_C, Y_C$ on the condenser lens 80. Thus, a defect of deviation located on the substrate 20 may be mapped to corresponding locations on both the reduction lens 82 and the condenser lens 80. By so mapping a substrate defect or deviation to each lens, a lens aberration, e.g., a coma lens aberration, indicated by undesirable sidewall angles detected by the AFM, may be traced to a possible source location on each of the lenses. While such defects may arise due to other sources, if the coma lens aberration is the cause of the defect, it may be traced to its source on the lens.

As shown in FIG. 6, the substrate 20 may be schematically divided into a grid in which each section is designated $X_{S1} \ldots X_{Sn}, Y_{S1} \ldots Y_{Sn}$. Similarly, the reduction lens 82 may be schematically divided into a grid in which each section is designated $X_{R1} \ldots X_{Rn}, Y_{R1} \ldots Y_{Rn}$. Similarly, the condenser lens 80 may be schematically divided into a grid in which each section is designated $X_{C1} \ldots X_{Cn}, Y_{C1} \ldots Y_{Cn}$. As shown in FIG. 6, a position at which a defect is located by the AFM, for example at $X_{S5}, Y_{S3}$, corresponds to a position $X_{R5}, Y_{R3}$ on the reduction lens 82, and corresponds to a position $X_{C5}, Y_{C3}$ on the condenser lens 80. Thus, when a defect or deviation has been detected and located on the substrate 20, it may be mapped to a corresponding position on the reduction lens 82 and to a corresponding position on the condenser lens 80, at which the, e.g., coma lens aberration may be located which gave rise to the defect located at the corresponding position on the substrate 20.

As should be understood, similar grids may be defined for the filter 78 and the reticle 72. While the description of the invention is applied particularly to the lenses 80 and 82, the filter 78 and the reticle 72 may also give rise to sidewall angle defects in the substrate, and defects in these elements giving rise to such substrate defects or deviations may be similarly mapped. Similarly, such mapping may be applied to detect and identify other lens aberrations which give rise to defect or deviations in the substrate and which may be detected and measured by an AFM.

In order to positively identify which element is the source of a given defect detected in the substrate 20 by the AFM, it may be necessary to move the suspect element by rotating it about an axis in the Z-direction, i.e., an axis which is perpendicular to the X,Y plane defined by the substrate 20 and other elements in the system. Thus, for example, if the reduction lens 82 is suspected of containing the coma lens aberration (or other lens aberration) giving rise to a non-vertical sidewall (e.g., the sidewall 18a or the sidewall 18b) in a substrate (e.g., 20), the following procedure would be used. Following exposure of a first substrate, the first substrate is scanned by the AFM. Assuming the first substrate is found by the AFM to contain a deviation, the exact location of the deviation is recorded. If, for example, the reduction lens 82 is suspected of harboring a coma lens aberration which gave rise to the deviation in the first substrate detected by the AFM, the reduction lens 82 is rotated by a selected angle. Since the lens aberration, e.g., a coma lens aberration, may reside in a particular location on the lens, moving the lens by some amount will also move the lens aberration by the same amount (assuming the aberration is non-symmetrical in relation to the movement of the lens). Similarly, other lens aberrations may be revealed by the non-movement of the AFM-detected deviation in the substrate. The first substrate is replaced by a second substrate, similarly located in the stepper system. The selected angle by which the lens is moved is carefully measured and recorded, so that the exact location of a corresponding deviation in the second substrate may be predicted. Then, the actinic radiation is passed through the system, including the reduction lens 82, to expose the radiation-sensitive material on the second substrate. If the aberration is in the reduction lens 82, the position on the substrate of, e.g., the resulting sidewall deviation in the second substrate will be found in the predicted position as a result of moving the lens 82. Since the predicted substrate location of the deviation is known, it is only necessary to scan with the AFM the second substrate in the area of the predicted location of the deviation. The second substrate is scanned by the AFM. If the sidewall angle deviation is found at the predicted location, the corresponding X,Y position on the reduction lens 82 will have been confirmed as the location of the coma lens aberration giving rise to the sidewall deviation.

If, on the other hand, the sidewall angle deviation remains in the same position on the substrate, then the reduction lens 82 possibly may be exonerated as the source of the deviation. Thereupon, the foregoing deviation-locating procedure may be repeated using another element of the lithographic system, such as the condenser lens 80. This procedure can be adapted or repeated as necessary for multiple sidewall angle deviations in the substrate 20, and for other lenses in the lithographic system.

In order to provide a repeatable and regular test pattern and location, it is advantageous to place test patterns at selected locations on the mask and wafer. Particular attention may then be directed to these test patterns by the AFM, avoiding the necessity of scanning and measuring extensive areas of the wafer substrate. In one embodiment, the test pattern is a star-like, or asterisk-like crossed pattern, having elements which intersect at both 90° and 45° in the X,Y or horizontal plane of the substrate. Since many lens aberrations manifest only at particular angles, e.g., 45° to the X and Y directions shown on the substrate 20 in FIGS. 2–4, such a star-like test pattern provides an optimum opportunity, in terms of both efficiency and completeness, to detect lens aberrations.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of detecting a lens aberration in a semiconductor production process, comprising the steps of:

(a) forming a feature by a process including a step of exposing a radiation-sensitive material to radiation, wherein said radiation passes through a lens;

(b) obtaining data relating to a sidewall angle at a plurality of adjacent locations of said feature by scanning at least one surface of said feature with an atomic force microscope;

(c) calculating the sidewall angle at said plurality of adjacent locations of said feature based on the data obtained by the atomic force microscope;

(d) comparing the sidewall angle obtained from the calculation step to a design sidewall angle for a lens free of aberration, thereby detecting the lens aberration when the comparison reveals a substantial difference between the calculated side wall angle and the design sidewall angle; and (e) identifying a lens position of the lens aberration by extrapolating from the locations of said feature having said substantial difference.

2. The method of claim 1, wherein the sidewall deviates from vertical as a result of a coma lens aberration.

3. The method of claim 1, wherein the sidewall deviates from vertical as a result of a spherical lens aberration.

4. The method of claim 1, wherein the sidewall deviates from vertical as a result of an astigmatic lens aberration.

5. The method of claim 1, wherein the sidewall deviates from vertical as a result of a monochromatic lens aberration.

6. The method of claim 1, wherein the sidewall deviates from vertical as a result of a chromatic lens aberration.

7. The method of claim 1, wherein the sidewall extends outwardly as a result of a coma lens aberration.

8. The method of claim 1, wherein the sidewall is undercut as a result of a coma lens aberration.

9. The method of claim 1, wherein the process of forming the feature includes the steps of applying the radiation-sensitive material to a substrate;

developing the radiation-sensitive material to form the feature.

10. The method of claim 1, wherein the difference between the calculated side wall angle and the design side wall angle is less than about 20 degrees.

11. The method of claim 1, wherein the difference between the calculated side wall angle and the design side wall angle is less than about 10 degrees.

12. The method of claim 11, wherein the step of identifying a lens position of the lens aberration on a lens L comprises determining a $X_L$, $Y_L$ location of the lens aberration on the lens L.

13. The method of claim 1, wherein the design side wall angle is normal to adjacent substrate surfaces.

14. The method of claim 1, wherein the method includes a step of locating the lens aberration on the lens by extrapolating from a position of said plurality of adjacent locations.

15. The method of claim 1, wherein the method includes a step of moving the lens suspected of harboring the lens aberration, and repeating the steps (a) to (e).

16. The method of claim 15, wherein moving the lens comprises rotating the lens in an X,Y plane defined by a surface of the substrate.

17. The method of claim 1, wherein the step of obtaining data relating to a sidewall angle comprises obtaining $X_s$, $Y_s$ data relating to a location of the sidewall angle.

* * * * *